US008605920B2

(12) United States Patent
Kim et al.

(10) Patent No.: US 8,605,920 B2
(45) Date of Patent: Dec. 10, 2013

(54) CONDENSER MICROPHONE HAVING FLEXURE HINGE DIAPHRAGM AND METHOD OF MANUFACTURING THE SAME

(71) Applicant: Electronics and Telecommunications Research Institute, Daejeon (KR)

(72) Inventors: Hye Jin Kim, Daejeon (KR); Sung Q Lee, Daejeon (KR); Kang Ho Park, Daejeon (KR); Jong Dae Kim, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 0 days.

(21) Appl. No.: 13/791,039

(22) Filed: Mar. 8, 2013

(65) Prior Publication Data

US 2013/0244365 A1 Sep. 19, 2013

Related U.S. Application Data

(62) Division of application No. 11/875,996, filed on Oct. 22, 2007, now Pat. No. 8,422,702.

(30) Foreign Application Priority Data

Dec. 6, 2006 (KR) ........................ 10-2006-0122736
Jun. 4, 2007 (KR) ........................ 10-2007-0054259

(51) Int. Cl.
*H01L 25/00* (2006.01)

(52) U.S. Cl.
USPC ........... 381/174; 381/122; 381/191; 381/355; 381/150; 216/2; 257/418; 438/48; 438/50; 438/53

(58) Field of Classification Search
USPC ...................... 381/122, 150, 191, 355; 216/2; 257/418; 438/48, 50, 53
See application file for complete search history.

(56) References Cited

U.S. PATENT DOCUMENTS 5,452,268 A 9/1995 Bernstein
5,870,482 A 2/1999 Loeppert et al.

(Continued)

FOREIGN PATENT DOCUMENTS

JP 59-079700 A 5/1984
JP 07-284199 10/1995

(Continued)

OTHER PUBLICATIONS

One The Single-Chip Condenser Miniature Microphone Using Drie and Backside Etching Techniques, Jing Chen, Litian Liu, Zhijian Li, Zhimin Tan, Yang Xu, and Jun Ma, Sensors and Actuators A 103 (2003) 42-47.

*Primary Examiner* — Thao Le
*Assistant Examiner* — Eric Jones
(74) *Attorney, Agent, or Firm* — Rabin & Berdo, P.C.

(57) ABSTRACT

A condenser microphone having a flexure hinge diaphragm and a method of manufacturing the same are provided. The method includes the steps of: forming a lower silicon layer and a first insulating layer; forming an upper silicon layer on the first insulating layer; forming sound holes by patterning the upper silicon layer; forming a second insulating layer and a conductive layer on the upper silicon layer; forming a passivation layer on the conductive layer; forming a sacrificial layer on the passivation layer; depositing a diaphragm on the sacrificial layer, and forming air holes passing through the diaphragm; forming electrode pads on the passivation layer and a region of the diaphragm; and etching the layers to form an air gap between the diaphragm and the upper silicon layer. Consequently, a manufacturing process may improve the sensitivity and reduce the size of the condenser microphone.

11 Claims, 5 Drawing Sheets

(56) References Cited

U.S. PATENT DOCUMENTS

| | | | | |
|---|---|---|---|---|
| 6,140,689 | A | 10/2000 | Scheiter et al. | |
| 6,423,563 | B2 * | 7/2002 | Fukada et al. | 438/50 |
| 6,677,176 | B2 * | 1/2004 | Wong et al. | 438/50 |
| 7,134,343 | B2 | 11/2006 | Suzuki et al. | |
| 7,146,016 | B2 * | 12/2006 | Pedersen | 381/175 |
| 7,281,304 | B2 | 10/2007 | Kim et al. | |
| 7,400,737 | B2 * | 7/2008 | Pedersen | 381/175 |
| 7,642,575 | B2 * | 1/2010 | Wong et al. | 257/254 |
| 7,825,484 | B2 | 11/2010 | Martin et al. | |
| 8,263,426 | B2 * | 9/2012 | Ko et al. | 438/53 |
| 8,395,227 | B2 * | 3/2013 | Watanabe et al. | 257/415 |
| 2003/0133588 | A1 * | 7/2003 | Pedersen | 381/423 |
| 2005/0005421 | A1 | 1/2005 | Wang et al. | |
| 2005/0101047 | A1 * | 5/2005 | Freeman et al. | 438/48 |
| 2006/0078137 | A1 | 4/2006 | Su et al. | |
| 2006/0093170 | A1 * | 5/2006 | Zhe et al. | 381/191 |
| 2007/0189555 | A1 | 8/2007 | Yamaoka et al. | |
| 2007/0261910 | A1 * | 11/2007 | Kasai et al. | 181/142 |
| 2008/0123242 | A1 * | 5/2008 | Zhou | 361/290 |
| 2008/0123878 | A1 * | 5/2008 | Zhe et al. | 381/191 |

FOREIGN PATENT DOCUMENTS

| | | | |
|---|---|---|---|
| JP | 11-014482 | A | 1/1999 |
| JP | 2001-508940 | A | 7/2001 |
| JP | 2004-328745 | A | 11/2004 |
| JP | 2005-191208 | A | 7/2005 |
| JP | 2006-108491 | A | 4/2006 |
| JP | 2006-157863 | A | 6/2006 |
| JP | 2006-224219 | A | 8/2006 |
| KR | 1020030004944 | | 1/2003 |
| KR | 20050066761 | | 6/2005 |
| KR | 10-0619478 | B1 | 8/2006 |
| KR | 10-0765149 | | 10/2007 |
| WO | 02/15636 | A2 | 2/2002 |
| WO | 03/045110 | | 5/2003 |
| WO | 2004/107810 | | 12/2004 |
| WO | 2006/116017 | A2 | 11/2006 |
| WO | 2006/123263 | A1 | 11/2006 |

* cited by examiner $d_{mux}$ = 0.7314E−4 μm/Pa

< Disk-shaped Diaphragm >

$d_{mux}$ = 0.01826 μm/Pa

< Flexure Hinge Diaphragm >

CONDENSER MICROPHONE HAVING FLEXURE HINGE DIAPHRAGM AND METHOD OF MANUFACTURING THE SAME

CROSS-REFERENCE TO RELATED APPLICATION

This is a divisional of co-pending U.S. Application Ser. No. 11/875,996, filed Oct. 22, 2007. This application also claims priority to and the benefit of Korean Patent Application Nos. 2006-122736, filed Dec. 6, 2006, and 2007-54259, filed Jun. 4, 2007, the disclosures of which are incorporated herein by reference in their entirety.

BACKGROUND

1. Field of the Invention

The present invention relates to a condenser microphone and a method of manufacturing the same, and more particularly, to a micromini condenser microphone having a flexure hinge diaphragm and a method of manufacturing the same.

This work was supported by the IT R&D program of Ministry of Information and Communication/Institute for Information Technology Advancement [2006-S-006-01, Components/Module technology for Ubiquitous Terminals.]

2. Discussion of Related Art

Generally, a condenser microphone uses a principle in which a change in capacitance caused by vibration of a diaphragm due to external vibration sound pressure is output into an electrical signal, which can be applied to a microphone, a telephone, a mobile phone and a video tape recorder.

FIG. 1A is a cross-sectional view of a conventional condenser microphone having a disk-shaped diaphragm, and FIG. 1B is a cross-sectional view of a conventional condenser microphone having a pleated diaphragm.

Referring to FIGS. 1A and 1B, the conventional condenser microphone includes a silicon wafer 11, a back plate 12 formed on the silicon wafer 11, and a diaphragm 14 disposed on the back plate 12 with an air gap 13 interposed therebetween. A plurality of sound holes 12*a* passing through the back plate 12 and in communication with the air gap 13 are formed, and an insulating layer 16 is formed between the back plate 12 and the diaphragms 14 and 15.

The diaphragm 14 illustrated in FIG. 1A has a disk-shape, and the diaphragm 15 illustrated in FIG. 1B has a pleated structure. Generally, the flexible diaphragms 14 and 15 may be formed to be easily vibrated by minor external vibration and to improve the sensitivity of a microphone, and thus a conventional diaphragm may be formed in a disk-shape or pleated structure to obtain mechanical flexibility.

However, the condenser microphone having the above-described structure may need an energy higher than a certain level to sufficiently vibrate the diaphragm, so the pleated diaphragm 15 illustrated in FIG. 1B may be formed rather than the disk-shaped diaphragm 14 illustrated in FIG. 1A, thereby enhancing flexibility of the diaphragm. However, sufficient sound pressure has to be input to vibrate the diaphragms of these condenser microphones.

Moreover, the conventional condenser microphones having the conventional structure described above have poor performance in a low frequency range when scaled-down to 1 mm or less using a semiconductor MEMS process. Also, general frequency response characteristics of the condenser microphone exhibit high sensitivity in a low frequency range when the area of the diaphragm is large, and low sensitivity in a high frequency range when the area of the diaphragm is small.

SUMMARY OF THE INVENTION

The present invention is directed to a condenser microphone having a flexure hinge diaphragm and a method of manufacturing the same.

The present invention is also directed to a condenser microphone covering an audible frequency range and exhibiting very high sensitivity using a flexure hinge diaphragm and a method of manufacturing the same.

One aspect of the present invention provides a method of manufacturing a condenser microphone, including the steps of: forming a lower silicon layer and a first insulating layer; forming an upper silicon layer to be used as a back plate on the first insulating layer; forming a plurality of sound holes by patterning the upper silicon layer; forming a second insulating layer on the upper silicon layer; forming a conductive layer on the upper silicon layer having the sound holes, and forming a passivation layer on the conductive layer; forming a sacrificial layer on the passivation layer; depositing a diaphragm on the sacrificial layer, and forming a plurality of air holes passing through the diaphragm; forming electrode pads on the passivation layer and a region of the diaphragm; and etching the sacrificial layer, the passivation layer, the conductive layer, the upper silicon layer, the first insulating layer and the lower silicon layer to form an air gap between the diaphragm and the upper silicon layer.

The method may use an SOI wafer formed of the lower silicon layer, the first insulating layer and the upper silicon layer. The sound holes may be formed by a deep reactive ion etching (DRIE) process. Forming the second insulating layer may include: depositing a second insulating layer on the upper silicon layer having the sound holes by chemical vapor deposition (CVD); and patterning the second insulating layer formed in the sound hole region to remain on an edge of the upper silicon layer by photolithography.

Forming the sacrificial layer may include spin-coating a planarization material to planarize an uneven region created by the sound holes, after depositing the sacrificial layer. The planarization material may include silicon on glass (SOG). The thickness of the sacrificial layer may be changed by controlling the number of spin-coatings, thereby controlling the height of the air gap formed between the diaphragm and the back plate. The diaphragm may be formed of at least one of silicon nitride, polyimide and polysilicon, and a metallic material. Forming the air holes in the diaphragm may be performed by etching.

Etching the sacrificial layer, the passivation layer, the conductive layer, the upper silicon layer, the first insulating layer and the lower silicon layer may include: etching the passivation layer, the conductive layer, the upper silicon layer, the first insulating layer and the lower silicon layer by the DRIE process; and etching the sacrificial layer by a wet etching process. To prevent deformation of the diaphragm during etching of the sacrificial layer, the method may further include: coating a photoresist layer on the diaphragm before etching the sacrificial layer; and removing the photoresist layer after etching the sacrificial layer.

Another aspect of the present invention provides a condenser microphone, including: a first insulating layer formed on a lower silicon layer; a back plate formed on the first insulating layer and having a plurality of sound holes passing through the back plate; a second insulating layer formed on an edge of the back plate such that the sound holes are not plugged; and a diaphragm including a contact region in contact with the second insulating layer, a vibration region forming an air gap with the back plate by upwardly projecting from the contact region, and a plurality of air holes passing through the vibration region.

The air holes may be in communication with the air gap and the sound holes. The back plate may be formed of a silicon layer. The diaphragm may be formed in a single layer or a multi-layer using at least one of silicon nitride, polyimide and polysilicon, and a metallic material. The metallic

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

Hereinafter, the present invention will be described in detail with reference to drawings illustrating exemplary embodiments of the present invention.

Figure 1A:
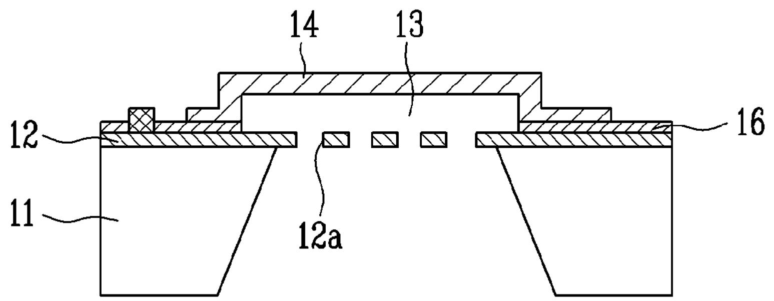
FIG. 1A (PRIOR ART)
FIG. 1A is a cross-sectional view of a conventional structure of a condenser microphone having a disk-shaped diaphragm.
Figure 1B:
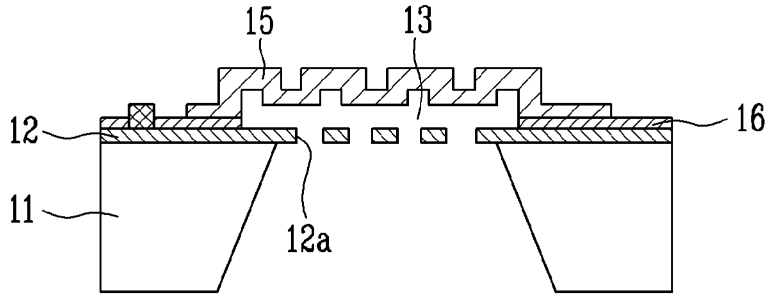
FIG. 1B (PRIOR ART)
FIG. 1B is a cross-sectional view of a conventional structure of a condenser microphone having a pleated diaphragm.
Figure 2A:
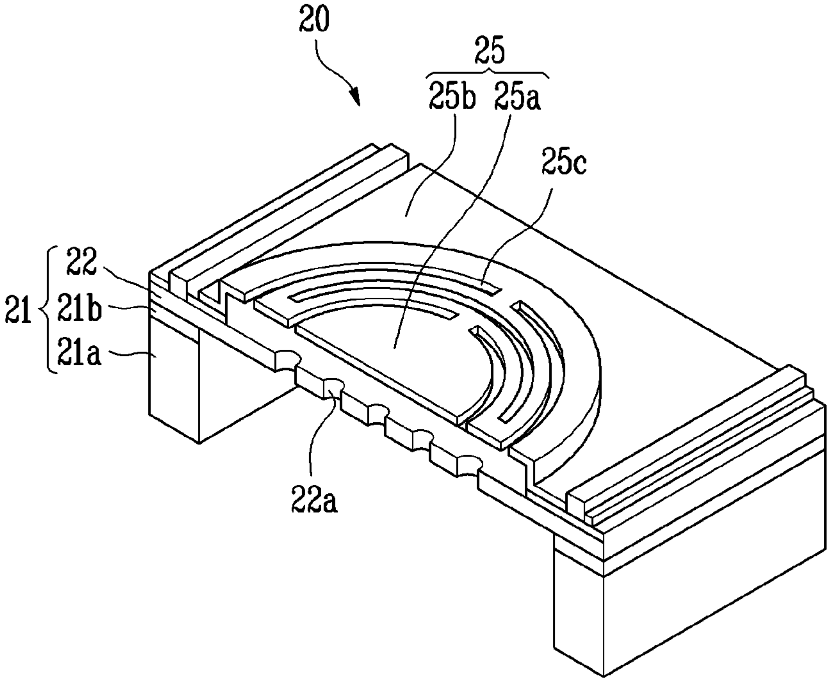
FIG. 2A is a partial perspective view of a structure of a condenser microphone having a flexure hinge diaphragm according to the present invention.
Figure 2B:
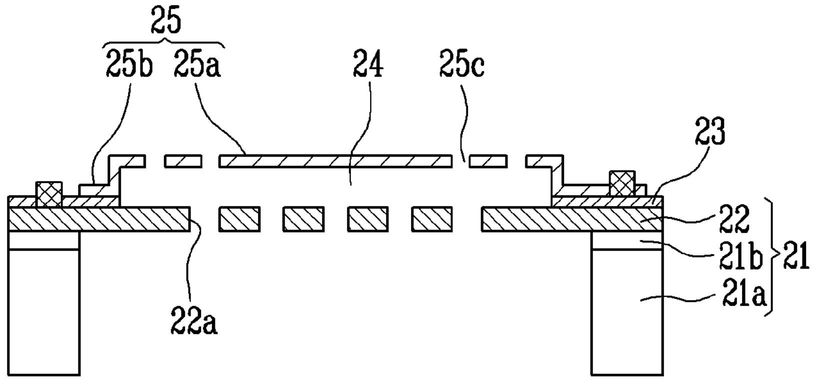
FIG. 2B is a cross-sectional view of the structure of the condenser microphone having the flexure hinge diaphragm according to the present invention.

FIG. 2A is a partial perspective view of a structure of a condenser microphone having a flexure hinge diaphragm according to the present invention, and FIG. 2B is a cross-sectional view of the structure of the condenser microphone having the flexure hinge diaphragm according to the present invention. For convenience of description, sectional lines for some elements such as a sound hole and an air hole will be omitted.

Referring to FIGS. 2A and 2B, a condenser microphone 20 according to the present invention includes a silicon on insulator (SOI) wafer 21 including a lower silicon layer 21*a*, a first insulating layer 21*b* and an upper silicon layer 22 used as a back plate (hereinafter, referred to as "a back plate 22"), a second insulating layer 23 formed along an edge of the back plate 22, and a diaphragm 25 formed over the back plate 22.

The diaphragm 25 includes a contact region 25*b* in contact with the second insulating layer 23 and a vibration region 25*a* upwardly projecting from the contact region 25*b*. An air gap 24 is formed between the vibration region 25*a* of the diaphragm 25 and the back plate 22, and a plurality of air holes 25*c* in communication with the air gap 24 and passing through the diaphragm 25 are formed in the vibration region 25*a* of the diaphragm 25. A plurality of sound holes 22*a* passing through the back plate 22 and in communication with the air gap 24 are formed in the back plate 22. Condenser microphones having various frequency characteristics can be manufactured depending on the size and number of the air holes 25*c* and the number, size and distribution of the sound holes 22*a*.

A method of manufacturing the condenser microphone having the above-described structure will now be described in detail with reference to FIGS. 3A to 3H. FIGS. 3A to 3H sequentially illustrate a manufacturing process of the condenser microphone of FIG. 2B.

Figure 3A:
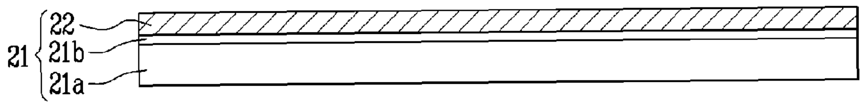
FIGS. 3A to 3H sequentially illustrate a manufacturing process of the condenser microphone of FIG. 2B.

Referring to FIG. 3A, to manufacture the condenser microphone according to the present invention, an SOI wafer 21 is first prepared. The SOI wafer 21 is composed of a lower silicon layer 21*a*, a first insulating layer 21 and an upper silicon layer 22 used as a back plate (hereinafter, referred to as "a back plate 22").

Figure 3B:
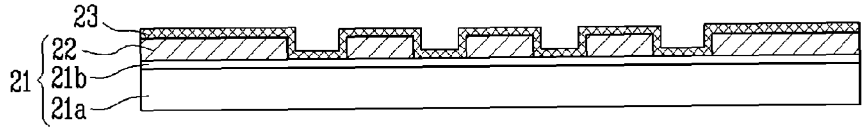

Referring to FIG. 3B, the back plate 22 is patterned to form sound holes 22*a* in the back plate 22. Here, deep reactive ion etching (DRIE) equipment is used. Then, an insulating layer 23 is formed on the patterned back plate 22. The insulating layer 23 is deposited by chemical vapor deposition (CVD).

Figure 3C:
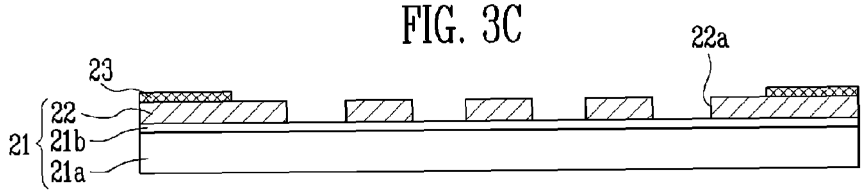

Referring to FIG. 3C, after forming the insulating layer 23, the insulating layer 23 is patterned to remain only on an outer region of the back plate 22 in which the sound holes 22*a* are not formed. Here, the insulating layer 23 is patterned by photolithography.

Figure 3D:
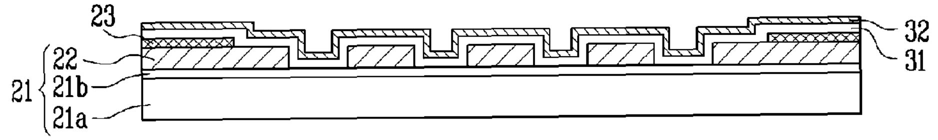

After that, referring to FIG. 3D, a conductive layer 31 is formed on the patterned insulating layer 23 and back plate 22. In this embodiment, the conductive layer 31 may be formed of a metal such as Al, Au or TiW by implanting charges into its surface. The conductive layer 31 is used as a lower electrode layer for applying an electrode of the back plate 22 to the condenser microphone. A passivation layer 32 protecting the conductive layer 31 is formed on the conductive layer 31.

Figure 3E:
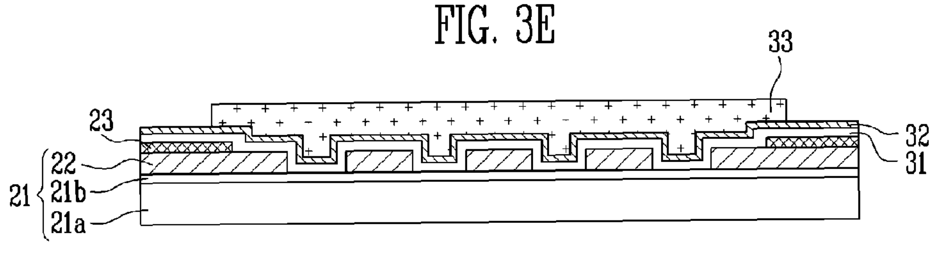

After that, referring to FIG. 3E, a sacrificial layer 33 is formed on the passivation layer 32. The sacrificial layer 33 formed on the passivation layer 32 is formed to cover the region having the sound holes 22*a*, and to expose edges of the passivation layer 32. The sacrificial layer 33 is formed of a material having an excellent etch selectivity with respect to the passivation layer 32 since it will be etched in the final step. The sacrificial layer 33 may be formed of one of various polymers such as silicon oxide, photoresist and polyimide, or metal materials such as Al. Also, in order to planarize the uneven sacrificial layer 33 formed in the sound hole region 22*a*, silicon on glass (SOG) may be employed. However, when the sacrificial layer 33 is formed of, for example, photoresist which cannot be processed at a high temperature, dry film-resist (DFR) may be employed. The planarization material for the sacrificial layer 33 may be coated several times by spin coating. A thickness of the sacrificial layer 33 may depend on the number of spin-coatings of the planarization material, thereby controlling the height of the air gap 24 formed between a diaphragm 25 and the back plate 22 during the vibration of the diaphragm 25. A sufficient space in which the diaphragm 25 and the back plate 22 are not in contact with each other may be created by controlling the height of the air gap 24 (refer to FIG. 3H).

Figure 3F:
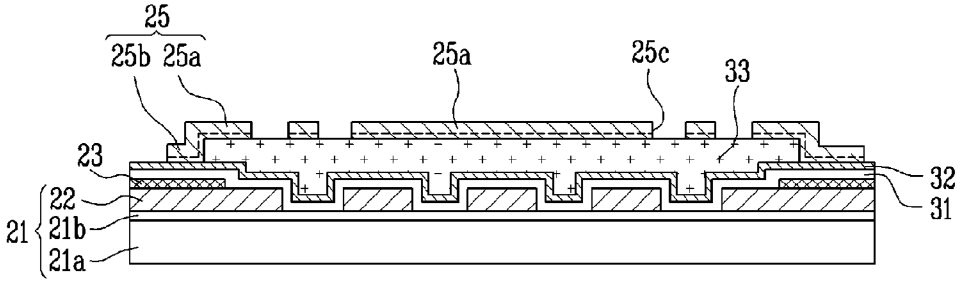

Referring to FIG. 3F, the diaphragm 25 surrounding the sacrificial layer 33 is formed over the sacrificial layer 33. The diaphragm 25 has a contact region 25*b* in contact with the passivation layer 32 and a vibration region 25*a* formed along the sacrificial layer 33. The diaphragm 25 is formed of metal and silicon nitride. In the present invention, the diaphragm 25 is formed of two layers of metal and silicon nitride. Meanwhile, the diaphragm 25 may include various materials such as silicon nitride, polyimide, polysilicon, etc., and metals such as Al, Ag, TiW and Cu. After the diaphragm 25 is formed on the sacrificial layer 33, a plurality of air holes 25*c* passing through the vibration region 25*a* of the diaphragm 25 are formed. The diaphragm 25 has an elastic deformable hinge structure having flexibility. The air holes 25*c* may have a hole shape and a slotted shape which is radially formed from centers of the vibration region 25*a*.

Figure 3G:
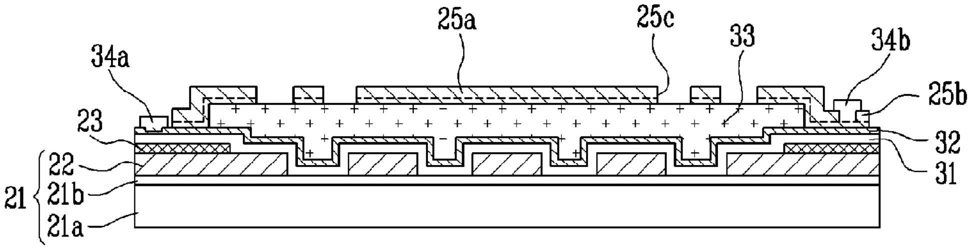

Referring to FIG. 3G, electrode pads 34*a* and 34*b* including positive and negative electrodes are formed. The electrode pad 34*a* is formed on the passivation layer 32 to be electrically connected with the conductive layer 31, and the electrode pad 34*b* is formed to be electrically connected with the diaphragm 25. To form the electrode pads 34*a* and 34*b*, a part of the contact region 25*b* between the passivation layer 32 and the diaphragm 25 is etched, and then a conductive material having a small surface resistance such as Au or Ag is deposited thereon and patterned.

Figure 3H:
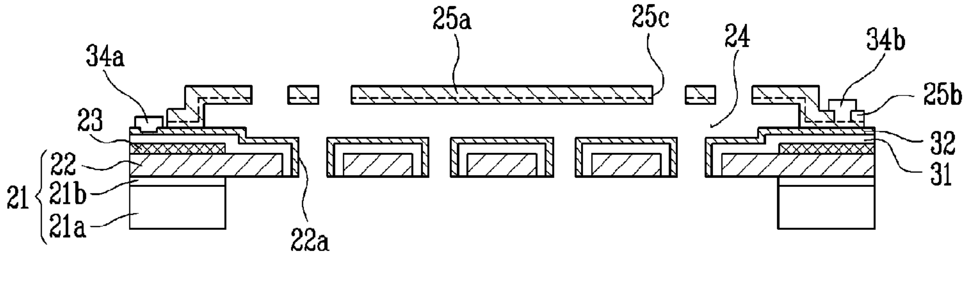

Referring to FIG. 3H, after forming the electrode pads 34*a* and 34*b*, the lower silicon layer 21*a*, the first insulating layer 21*b*, the conductive layer 31, the passivation layer 32 and the sacrificial layer 33 are etched. The lower silicon layer 21*a*, the first insulating layer 21*b*, the conductive layer 31 and the passivation layer 32 are etched by a DRIE process, and the sacrificial layer 33 is removed by a wet etching process. As the lower silicon layer 21*a*, the first insulating layer 21*b* and the conductive layer 31 are removed, a plurality of sound holes 22*a* are formed in the upper silicon layer used as the back plate 22, and as the sacrificial layer 33 is removed, an air gap 24 in communication with the air holes 25*c* and the sound holes 22*a* is formed. Forming the air gap 24 further includes applying photoresist on the diaphragm 25 to prevent deformation of the diaphragm 25 that can occur in the removal of the sacrificial layer 33, and removing the photoresist applied on the diaphragm 25 using a dry etching process after the removal of the sacrificial layer 33.

The condenser microphone 20 manufactured by the above-described process may variously change frequency characteristics and sensitivity by controlling the thickness of the diaphragm 25 or the diameter, width and thickness of the vibration region 25*a*, the length and number of the air holes 25*c*, or the number, size and distribution of the sound holes 22*a* formed in the back plate 22. When the flexure hinge diaphragm 25 manufactured in the above-described process is used, the condenser microphone is more flexible than that using the conventional disk-shaped or pleated diaphragm, so it may be more sensitively vibrated due to external sound pressure which is input to the microphone, and increase its output voltage.

Figure 4A:
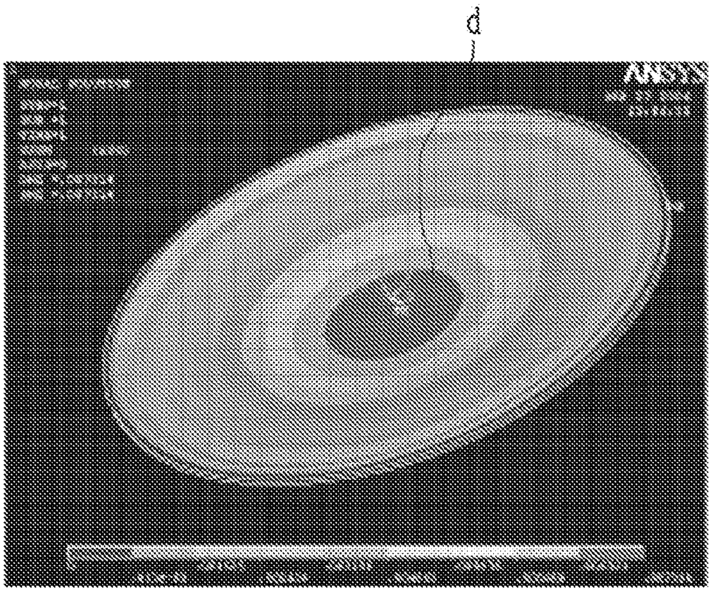
FIG. 4A (PRIOR ART)
FIG. 4A illustrates flexibility of a conventional disk-shaped diaphragm.
Figure 4B:
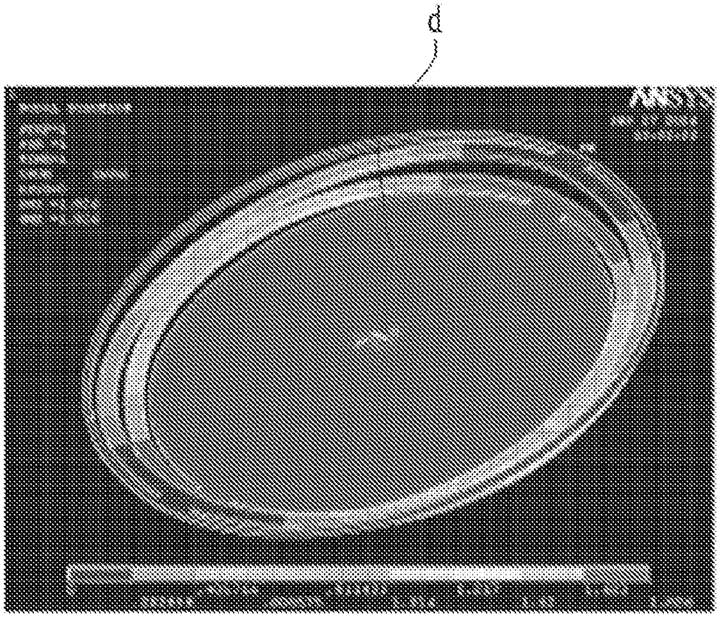
FIG. 4B illustrates flexibility of a flexure hinge diaphragm according to the present invention.

FIG. 4A illustrates flexibility of a conventional disk-shaped diaphragm, and FIG. 4B illustrates flexibility of a flexure hinge diaphragm according to the present invention.

Referring to FIG. 4A, when the conventional disk-shaped diaphragm is used, a displacement ($d_{max}$) is 0.7314E-4 μm/Pa, and referring to FIG. 4B, when the diaphragm in the present invention is used, a displacement ($d_{max}$) is 0.01826 μm/Pa. These are results obtained under the same conditions, e.g., the thickness and material of the diaphragm, the number of the sound holes, applied voltage, etc., which show that the diaphragm of the present invention has a vibration range (d) 250 times larger than the conventional diaphragm. When the conventional condenser microphone is reduced to a certain size or less (i.e., 1 mm or less), its sensitivity is decreased and its performance is poor in a low frequency range. However, even when the condenser microphone including the flexure hinge diaphragm according to the present invention is manufactured to a size of 1 mm or less, it has very high sensitivity so that it may cover all audio frequency ranges.

According to the above-described structure, the present invention may include a flexure hinge diaphragm having a plurality of air holes, thereby being more sensitively vibrated by external sound pressure which is input to the microphone and increasing output voltage.

Also, even when the diaphragm formed by the above-described manufacturing process has a small size, it may have very high sensitivity, and thus may cover all audio frequency ranges. A condenser microphone of the present invention employs a silicon wafer, so it may be integrated with a driving circuit of a CMOS transistor and also applied to mobile devices such as mobile phones, PDAs and PMPs.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method of manufacturing a condenser microphone, comprising the steps of:

forming a lower silicon layer and a first insulating layer;

forming an upper silicon layer to be used as a back plate on the first insulating layer;

forming a plurality of sound holes by patterning the upper silicon layer;

forming a second insulating layer on the upper silicon layer;

forming a conductive layer on the upper silicon layer having the sound holes, and forming a passivation layer on the conductive layer;

forming a sacrificial layer on the passivation layer;

depositing a diaphragm on the sacrificial layer, wherein the diaphragm is a flexure hinge-shaped diaphragm, and forming a plurality of air holes passing through the diaphragm;

forming electrode pads on the passivation layer and a region of the diaphragm; and etching the sacrificial layer, the passivation layer, the conductive layer, the upper silicon layer, the first insulating layer and the lower silicon layer to form an air gap between the diaphragm and the upper silicon layer.

2. The method according to claim 1, wherein the condenser microphone uses an SOI wafer formed of the lower silicon layer, the first insulating layer and the upper silicon layer.

3. The method according to claim 1, wherein the sound holes are formed by a deep reactive ion etching (DRIE) process.

4. The method according to claim 1, wherein the step of forming the second insulating layer comprises the steps of:

depositing a second insulating layer on the upper silicon layer having the sound holes by chemical vapor deposition (CVD); and patterning the second insulating layer formed in the sound hole region to remain on an edge of the upper silicon layer using a photolithography process.

5. The method according to claim 1, wherein the step of forming the sacrificial layer comprises the step of:

after depositing the sacrificial layer, spin-coating a planarization material to planarize an uneven region created by the sound holes.

6. The method according to claim 5, wherein the planarization material comprises silicon on glass (SOG).

7. The method according to claim 6, wherein the thickness of the sacrificial layer is changed by controlling the number of spin-coatings, thereby controlling the height of the air gap formed between the diaphragm and the back plate.

8. The method according to claim 1, wherein the diaphragm is formed of at least one of silicon nitride, polyimide and polysilicon, and a metallic material.

9. The method according to claim 8, wherein the step of forming the air holes in the diaphragm is performed by etching.

10. The method according to claim 1, wherein the step of etching the sacrificial layer, the passivation layer, the conductive layer, the upper silicon layer, the first insulating layer and the lower silicon layer comprises the steps of:

etching the passivation layer, the conductive layer, the upper silicon layer, the first insulating layer and the lower silicon layer using a DRIE process; and etching the sacrificial layer using a wet etching process.

11. The method according to claim 10, further comprising the steps of:

to prevent deformation of the diaphragm during etching of the sacrificial layer, coating a photoresist layer on the diaphragm before etching the sacrificial layer; and removing the photoresist layer after etching the sacrificial layer.

* * * * *